(12) United States Patent
Yater et al.

(10) Patent No.: US 9,685,339 B2
(45) Date of Patent: Jun. 20, 2017

(54) SCALABLE SPLIT GATE MEMORY CELL ARRAY

(71) Applicants: Jane A. Yater, Austin, TX (US); Cheong Min Hong, Austin, TX (US); Sung-Taeg Kang, Austin, TX (US); Ronald J. Syzdek, Austin, TX (US)

(72) Inventors: Jane A. Yater, Austin, TX (US); Cheong Min Hong, Austin, TX (US); Sung-Taeg Kang, Austin, TX (US); Ronald J. Syzdek, Austin, TX (US)

(73) Assignee: NXP USA, Inc., Austin, TX (US)

( * ) Notice: Subject to any disclaimer, the term of this patent is extended or adjusted under 35 U.S.C. 154(b) by 523 days.

(21) Appl. No.: 13/873,917

(22) Filed: Apr. 30, 2013

(65) Prior Publication Data

US 2014/0319593 A1    Oct. 30, 2014

(51) Int. Cl.
*H01L 27/115* (2017.01)
*H01L 21/28* (2006.01)
*H01L 29/423* (2006.01)
*H01L 27/11521* (2017.01)

(52) U.S. Cl.
CPC .. *H01L 21/28273* (2013.01); *H01L 27/11521* (2013.01); *H01L 29/42328* (2013.01); *H01L 29/42332* (2013.01)

(58) Field of Classification Search
CPC ......... H01L 21/28273; H01L 27/11521; H01L 29/42332; H01L 29/42328
USPC .......................................................... 257/316
See application file for complete search history.

(56) References Cited

U.S. PATENT DOCUMENTS

| 6,861,698 B2 | 3/2005 | Wang |
| 7,227,217 B2 | 6/2007 | Levi et al. |
| 2012/0206969 A1* | 8/2012 | Gu .................... H01L 21/28273 365/185.18 |

OTHER PUBLICATIONS

Merriam-Webstere OnLine definition of converge. No date.*

* cited by examiner

*Primary Examiner* — Hrayr A Sayadian (57) ABSTRACT

A split gate memory array includes a first row having memory cells; a second row having memory cells, wherein the second row is adjacent to the first row; and a plurality of segments. Each segment includes a first plurality of memory cells of the first row, a second plurality of memory cells of the second row, a first control gate portion which forms a control gate of each memory cell of the first plurality of memory cells, and a second control gate portion which forms a control gate of each memory cell of the second plurality of memory cells. The first control gate portion and the second control gate portion converge to a single control gate portion between neighboring segments of the plurality of segments.

20 Claims, 5 Drawing Sheets

SCALABLE SPLIT GATE MEMORY CELL ARRAY

BACKGROUND

Field

This disclosure relates to split gate memory cells and more particularly to arrays for split gate memory cells that are scalable.

Related Art

Non-volatile data storage is commonly used in integrated circuits. In one type of semiconductor device structure used for non-volatile data storage the cell includes a control gate and a select gate. When both gates are over different portions of the same channel, this type of memory cell is commonly referenced as a split gate memory cell. In this type of arrangement, the control gate is typically electrically in common for all of the memory cells for a given sector. In laying out the array for such a memory, issues include the interaction between these two gates. The select gate is particularly important for speed of access, especially reads, because they are significant to cell selection. Thus, issues relate to ensuring that the select gate has low impedance so that it can be switched between selected and deselected quickly. While speed is significant so is space. The desired speed is preferably not achieved at the cost of additional space. Speed will typically improve as the feature sizes reduce and it is desirable that a given layout not have to be greatly changed in order take advantage of the increased speed and reduced size opportunity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, adjacent rows of a split gate memory have their control gates converge near locations where the select gates are strapped to a metal contact to provide for low impedance signal propagation for the select gates. By converging the adjacent control gates, there is additional room for the select gate contacts to allow for closer spacing of adjacent select gates. This is better understood by reference to the FIGs. and the following description.

Figure 1:
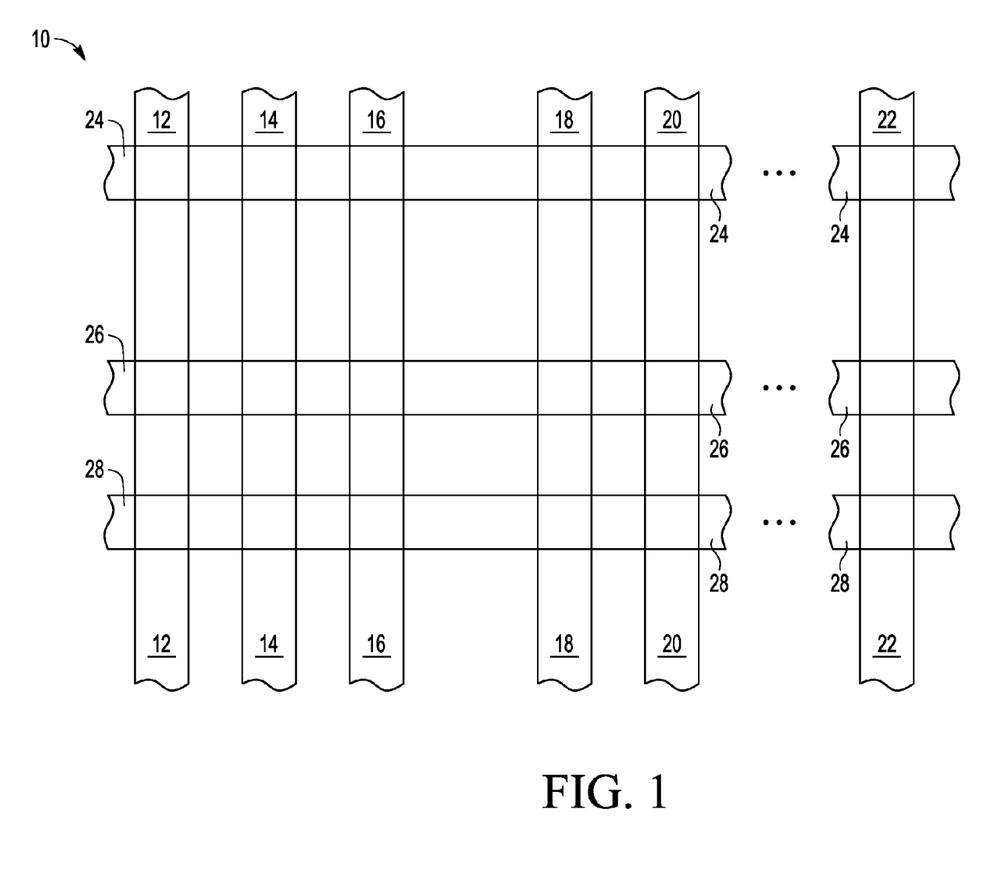
FIG. 1 illustrates a layout of a split gate memory array at a stage of processing in accordance with an embodiment of the present invention.

FIG. 1 illustrates a top view of a split gate memory array 10 at a stage in processing in which active regions such as active regions 12, 14, 16, 18, 20, and 22 and select gates such as select gates 24, 26, and 28 have been formed. Select gates 24, 26, and 28 are parallel and run horizontally as shown in FIG. 1 and may be of polysilicon and may have an upper silicide layer. They could also be of another conductor such as metal. Active regions 12, 14, 16, 18, 20, and 22 are in a substrate and defined by isolation regions which may be of oxide. Active regions 12, 14, 16, 18, 20, and 22 are parallel and run vertically as shown in FIG. 1. They, in this example, have the same width. Split gate memory array 10 would have many more active regions and select gates than those shown. In a typical example, split gate memory array 10 would comprise a plurality of sectors in which the memory cells of each sector would be erasable together. Active regions 16 and 18 are for dummy cells used to provide a symmetric border for the memory cells adjacent to them. For example, active region 14 is for active cells and is bordered on one side by active region 12. Active region 16 provides a border on the opposite side that is the same as the border provide by active region 12.

Figure 2:
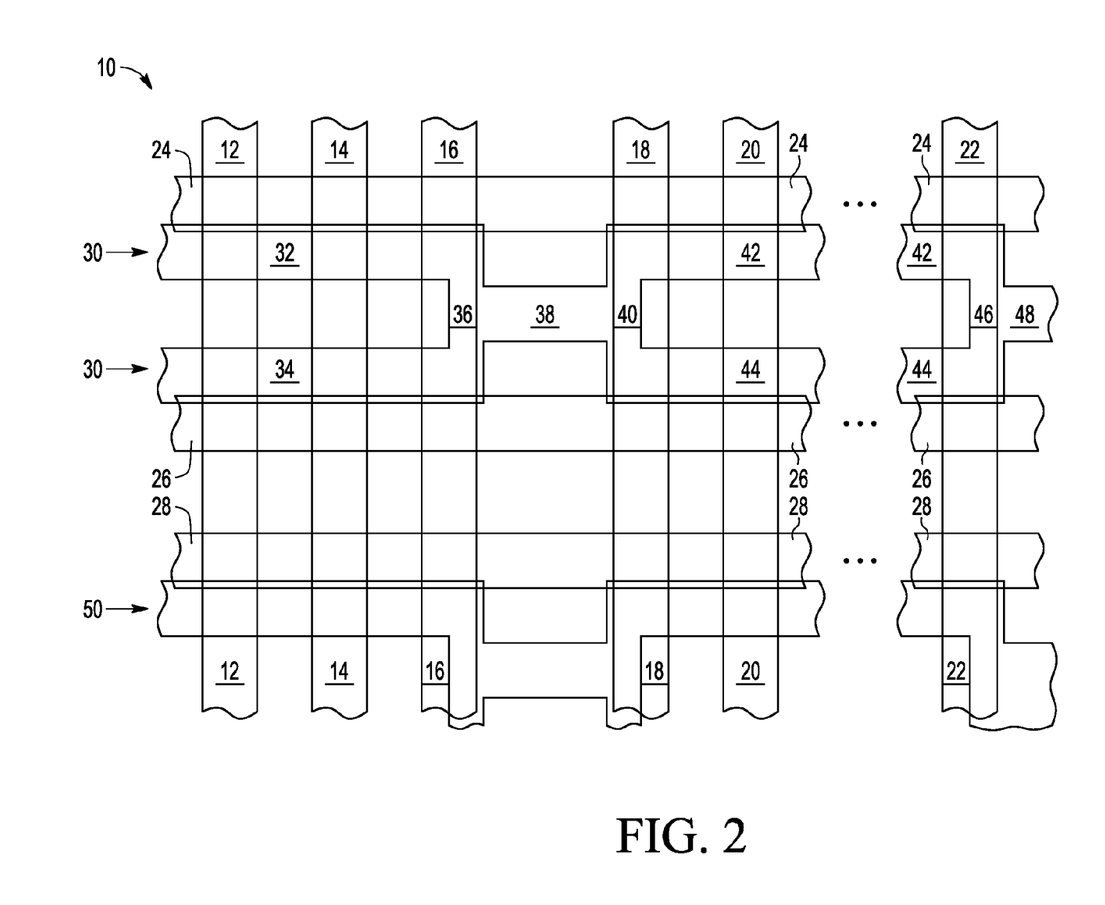
FIG. 2 illustrates a layout the split gate memory array of FIG. 1 at a subsequent stage of processing in accordance with an embodiment of the present invention.

FIG. 2 illustrates split gate memory array 10 at a subsequent stage in processing in which common control gate conductors 30 and 50 are formed. Control gate conductor 30 has a control gate portion 32 that horizontally crosses active regions 12 and 14, a control gate portion 42 that horizontally crosses active region 20, a control gate portion 34 below in FIG. 2 and in parallel with control gate portion that crosses active regions 12 and 14, a control gate portion 44 below in FIG. 2 and in parallel with control gate portion 42 that crosses active region 20, a row strap conductor 36 running vertically over a portion of active region 16 and connecting control gate portions 32 and 34, a row strap conductor 40 running vertically over a portion of active region 18 and connecting control gate portions 42 and 44, a segment strap 38 running horizontally and connected to row straps 36 and 40, a row strap running vertically over a portion of active region 22 and connecting control gate portions 24 and 42, and a segment strap 48 running horizontally and connected to row strap 46 and another row strap not shown in FIG. 2. Control gate portion 32 partially overlaps select gate 24. Control gate portion 34 partially overlaps select gate 26. Control gate portion 42 partially overlaps select gate 24. Control gate portion 44 partially overlaps select gate 26. Segment strap 38 is spaced from both select gate 24 and 26. Control gate portions 32 and 34 converge through row strap 36 over active region 16 and through row strap 40 over active region 18. Continuity of control gate 30 is maintained between row straps 36 and 40 by segment strap 38 which runs in line with a line running midway between control gate portions 32 and 34 as well as between control gate portions 42 and 44. The effect is that continuity of the control gate conductor 30 is maintained while obtaining spacing from select gates 24 and 26 in the region between active regions 16 and 18. Control gate conductor 50 is for the same purpose as control gate conductor 30 for select gate 28 and an adjacent select gate, not shown, that would be below select gate 28 in FIG. 2.

Figure 3:
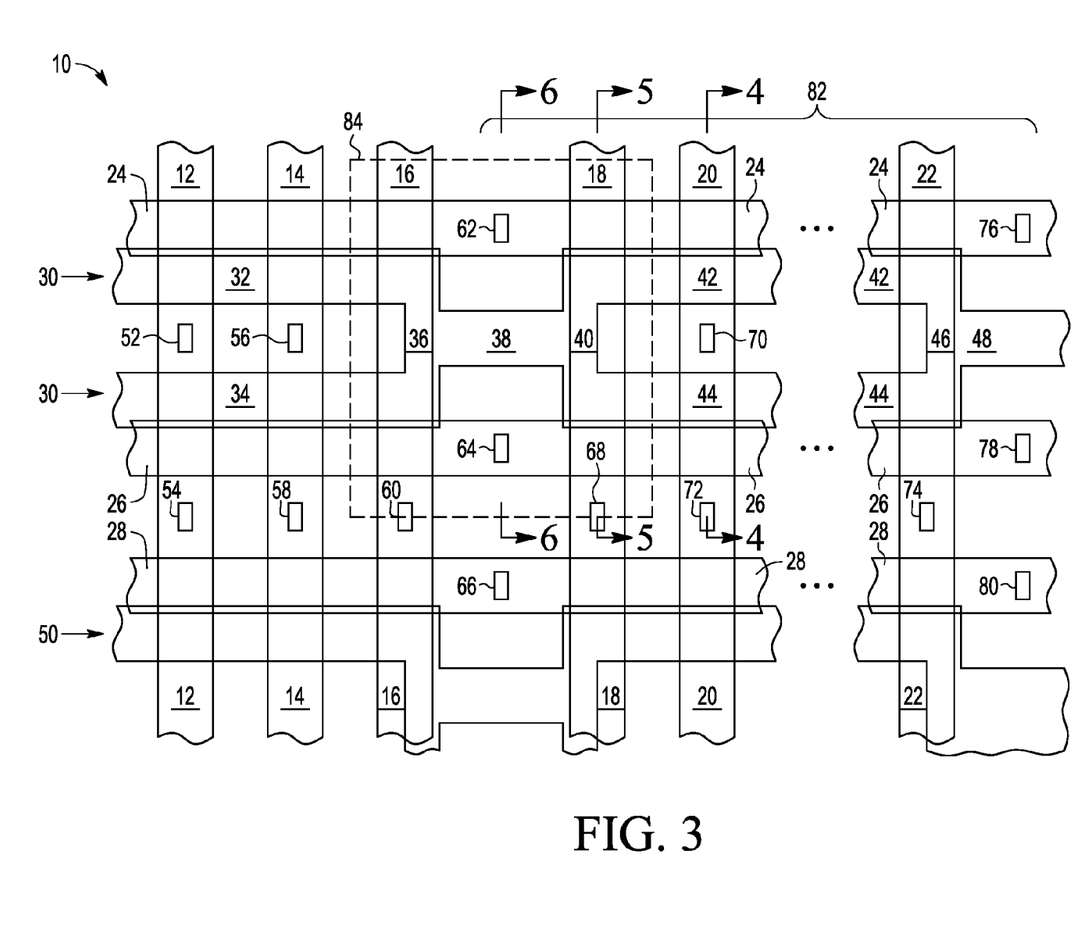
FIG. 3 illustrates the split gate memory array of FIG. 2 at a subsequent stage of processing in accordance with an embodiment of the present invention.

Shown in FIG. 3 are contact 52 contacting active region 12 between control gate portions 32 and 34, contact 54 contacting active region 12 between select gate 26 and select gate 28, a contact 56 contacting active region 14 between control gate portions 32 and 34, a contact 58 contacting active region 14 between select gates 26 and 28, a contact 60 contacting active region 16 between select gates 26 and 28, a contact 62 contacting select gate 24 between active regions 16 and 18, a contact 64 contacting select gate 26 between active regions 16 and 18, a contact 66 contacting select gate 28 between active regions 16 and 18, a contact 68 contacting active region 18 between select gates 26 and 28, a contact 70 contacting active region 20 between control gate portions 42 and 44, a contact 72 contacting active region 20 between select gates 26 and 28, a contact 74 contacting active region 22 between select gates 26 and 28, a contact 76 contacting select gate 24 between active region 22 and another active region that is not shown in FIG. 3, a contact 78 contacting select gate 26 between active region 22 and the other active region that is not shown in FIG. 3, and a contact 80 contacting select gate 28 between active region 22 and the other active region that is not shown in FIG. 3. A segment length 82 is shown as a length which spans the distance between centers of consecutive segments straps 48 and 38. Segment length may also be considered the distance from a segment strap to the end of the row. A convergence region 84, for a given control gate conductor such as control gate conductor 30, comprises row strap 36, segment strap 38, and row strap 40. As an example of possible dimensions, the select gates may be 0.12 micron wide, the portions of the control gate conductor may each be 0.18 micron wide, the distance between active regions 16 and 18 may be 0.39 microns, the distance between select gates 26 and 28 may be 0.27 micron, the distance between control gate portions 42 and 44 may be 0.33 micron, and the distance between active regions 12 and 14 and between 14 and 16 may be 0.14 micron. These dimensions, including the ratios, will vary with the particular lithographic capabilities of a particular process that is intended to be used.

The feature of adjacent control gate portions converging to provide distance from the select gates that they overlap allows for contacts 62, 64, 66, 76, 78, and 80 to land directly on select gates 24, 26, and 28. This avoids requiring tabs being required for these contacts and the corresponding additional spacing that would then be required to accommodate these tabs. This allows for avoiding increasing the array size to accommodate the tabs. This allows for scaling as dimensions decrease.

Figure 4:
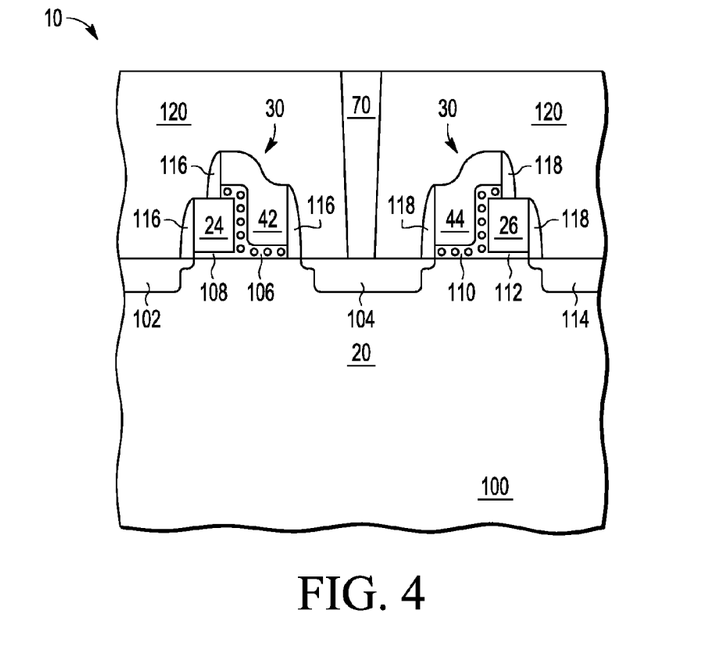
FIG. 4 illustrates a cross section at a first location of the split gate memory array.

FIG. 4 illustrates split gate memory array 10 taken at a cross section 4 shown in FIG. 3 in which active region 20 is in a substrate 100 which may be silicon. Shown is a drain region 102, a source region 104, a drain region 114, select gate 24 over a gate dielectric 108 which is on substrate 100, control gate portion 42 partially overlapping select gate 24 and over a nanocrystal layer 106 that extends to a region between select gate 24 and control gate portion 42, a sidewall spacer 116 adjacent to the sides of select gate 24 and control gate portion 42 other than the side between them, control gate portion 44 over a nanocrystal layer 110 on substrate 100, select gate 26 over a gate dielectric 112 with nanocrystal layer 110 extending to the region between select gate 26 and control gate portion 44, a sidewall spacer 118 adjacent to the sides of select gate 26 and control gate 44 other than the side between them, and an interlayer dielectric 120 covering select gates 24 and 26 and control gate portions 42 and 44 and surrounding contact 70. This shows a pair of split gate memory cells that can operate in conventional split gate fashion.

Figure 5:
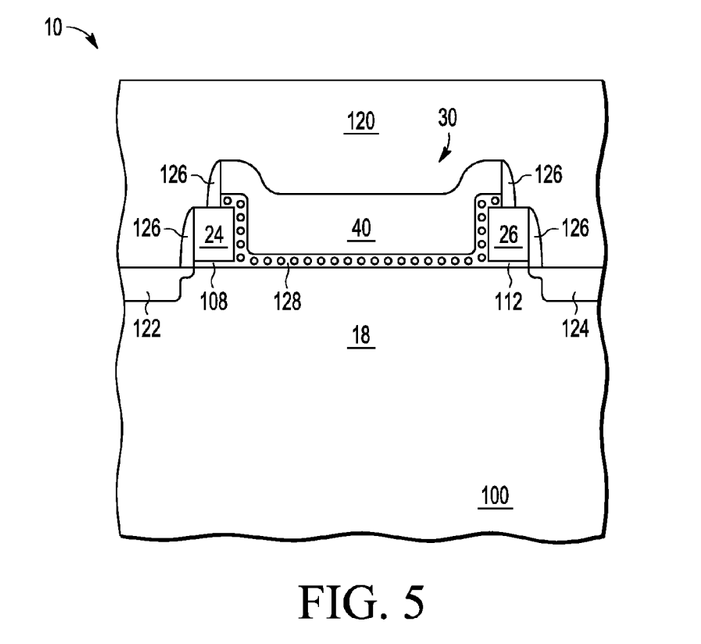
FIG. 5 illustrates a cross section at a second location of the split gate memory array.

FIG. 5 illustrates split gate memory array 10 through cross section 5 shown in FIG. 3 that shows a doped region 122 in substrate 100 of active region 18 which is for dummy cells. Row strap 40 extends between select gates 24 and 26 which are over gate dielectrics 108 and 112, respectively. Row strap 40 is over nanocrystal layer 128 which is on substrate 100 and also between row strap 40 and select gate 24 and between row strap 40 and select gate 26. Interlayer dielectric 120 covers row strap 40 and select gates 24 and 26. This shows the result of control gate portions 42 and 44 converging to form row strap 40. For the case where speed requirements result in the need for contacting the select gate part way through the array, even in the case of using tabs for the contact, the array will need to be opened in order to make room for the contact. Opening the array results in a discontinuity in the array so that dummy cells are typically necessary at the interface of the discontinuity. Because there is then a dummy cell location which is necessary anyway in order to have a contact to the select gates due to a speed requirement, there is no additional space required for the convergence of control gate portions 42 and 44 in order to maintain continuity of the control gate conductor along the row direction.

Figure 6:
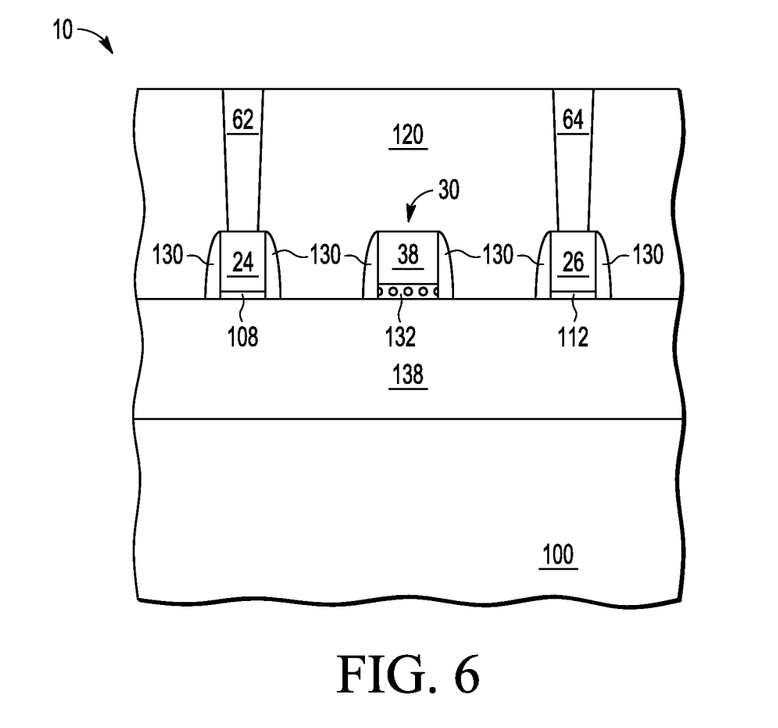
FIG. 6 illustrates a third location of the split gate memory array.

FIG. 6 illustrates split gate memory array 10 through cross section 6 shown in FIG. 3 which shows segment strap 38 between select gates 24 and 26 which are contacted by contacts 62 and 64, respectively. An isolation region 138 is formed in substrate 100. Gate dielectrics 108 and 112 are shown as being under select gates 24 and 26 which may not be visible in the case of the gate dielectrics being oxide and isolation 138 being oxide. A nanocrystal layer 132 is under segment strap 38 which is a portion of control gate conductor 30. Contacts 62 and 64 contact select gates 24 and 26, respectively. Interlayer dielectric 120 is over select gates 24 and 26 and segment strap 38 and around contacts 62 and 64. This shows the space available for making contacts that contact select gates 24 and 26 in a location where they are sufficiently distant from segment strap 38 that maintains the continuity of control gate conductor 30 by being continuous with row straps 36 and 40 which are in turn convergences of control gate portions 32 and 34 and control gate portions 42 and 44, respectively.

Thus it is seen that space that may already be necessary for forming contacts to select gates can be utilized to avoid having to space the select gates further apart than is otherwise required. In the region where the space is created for a select gate contact, which results in needing dummy cells, making tabs for contacts 64 and 66 would potentially bring the tab from one too close to the other select gate. Further, the tabs themselves would have to be spaced from each other. Extending the tabs cannot be extended in the other direction because the control gate overlaps the select gate in that direction. Thus, the array described and shown provides for providing the contact to the select gates without requiring extra select gate spacing and without requiring tabs while not compromising performance.

By now it should be appreciated that there has been provided a split gate memory array having a plurality of rows. The split gate memory array further includes a first segment of split gate memory cells. The first segment includes a first plurality of split gate memory cells along a first row of the first segment. The first segment further includes a second plurality of split gate memory cells along a second row of the first segment, wherein the second row is adjacent the first row. The first segment further includes a first control gate conductor which forms a control gate of each of the first plurality of split gate memory cells. The first segment further includes a second control gate conductor which forms a control gate of each of the second plurality of split gate memory cells. The first segment further includes a row strap conductor which is physically connected between the first control gate conductor and the second control gate conductor. The split gate memory array further includes a second segment of split gate memory cells. The second segment includes a first plurality of split gate memory cells along a first row of the second segment. The second segment further includes a second plurality of split gate memory cells along a second row of the second segment, wherein the second row of the second segment is adjacent the first row of the second segment. The second segment further includes a first control gate conductor which forms a control gate of each of the first plurality of split gate memory cells of the second segment. The second segment further includes a second control gate conductor which forms a control gate of each of the second plurality of split gate memory cells of the second segment. The second segment further includes a row strap conductor which is physically connected between the first control gate conductor and the second control gate conductor. The split gate memory array further includes a segment strap conductor physically connected between the row strap conductor of the first segment and the row strap conductor of the second segment. The split gate memory array may further include a first select gate conductor which forms a select gate of each of the first plurality of split gate memory cells of the first segment and of the second segment, and a second select gate conductor which forms a select gate of each of the second plurality of split gate memory cells of the first segment and of the second segment, wherein the segment strap conductor is located between the first select gate conductor and the second select gate conductor. The split gate memory may have a further characterization by which the segment strap conductor comprises polysilicon. The split gate memory may have a further characterization by which the segment strap conductor is formed in a same polysilicon layer as the first and second control gate conductors of the first and second segments. The split gate memory array may further include a first contact connected to the first select gate conductor between the first segment and the second segment and a second contact connected to the second select gate conductor between the first segment and the second segment, wherein the segment strap conductor is located between the first and second contacts. The split gate memory may have a further characterization by which the first segment further includes a plurality of active regions which are intersected by the first control gate conductor of the first segment and the second control gate conductor of the first segment, wherein each intersection corresponds to a split gate memory cell and a dummy active region, wherein the row strap conductor is over the dummy active region. The split gate memory may have a further characterization by which the first segment further includes a first source/drain contact connected to each of the active regions of the first segment, each of the first source/drain contacts located between the first control gate conductor and the second control gate conductor of the first segment. The split gate memory may have a further characterization by which the first segment further includes a second source/drain contact connected to each of the active regions of the first segment, wherein the second control gate conductor of the first segment is located between the second source/drain contacts and the first source/drain contacts. The split gate memory may have a further characterization by which the row strap conductor of the first segment is substantially perpendicular to the first and second control gate conductors of first segment and the row strap conductor of the second segment is substantially perpendicular to the first and second control gate conductors of the second segment.

Also disclosed is a split gate memory array having a first row having memory cells. The split gate memory array further includes a plurality of segments and a second row having memory cells, wherein the second row is adjacent to the first row. Each segment includes a first plurality of memory cells of the first row, a second plurality of memory cells of the second row, a first control gate portion which forms a control gate of each memory cell of the first plurality of memory cells, and a second control gate portion which forms a control gate of each memory cell of the second plurality of memory cells. The first control gate portion and the second control gate portion converge to a single control gate portion between neighboring segments of the plurality of segments. The split gate memory array may further include a first select gate portion which forms a select gate of each memory cell of the first plurality of memory cells and a second select gate portion which forms a select gate of each memory cell of the first plurality of memory cells. The split gate memory array may have a further characterization by which the first select gate portion forms a select gate of a third plurality of memory cells of the first row of a neighboring segment of the plurality of segments, and the second select gate portion forms a select gate of a fourth plurality of memory cells of the second row of the neighboring segment of the plurality of segments. The split gate memory array may have a further characterization by which each single control gate portion is located between the first select gate portion and the second select gate portion. The split gate memory array may further include a first contact connected to the first select gate portion between neighboring segments of the plurality of segments and The split gate memory array may have a further characterization by which a second contact connected to the second select gate portion between neighboring segments of the plurality of segments. The split gate memory array may have a further characterization by which each single control gate portion between neighboring segments is located between the first contact and the second contact between the neighboring segments. The split gate memory array may have a further characterization by which each segment includes a plurality of active regions which are intersected by the first control gate portion and the second control gate portion, a first dummy active region, and a second dummy active region, wherein the plurality of active regions is located between the first and second dummy active regions. The split gate memory array may have a further characterization by which the convergences between the first and second control gate portions are located between the plurality of active regions of neighboring segments of the plurality of neighboring segments. The split gate memory array may have a further characterization by which each segment includes a first plurality of source/drain contacts connected to each of the plurality of active regions between the first control gate portion and the second control gate portion and a second plurality of source/drain contacts connected to each of the plurality of active regions, wherein the second control gate portion and the second select gate portion are located between the first plurality of source/drain contacts and the second plurality of source/drain contacts. The split gate memory array may have a further characterization by which the single control gate portion is formed in a same polysilicon layer as the first and second control gate portions. The split gate memory array may have a further characterization by which the single control gate portion is substantially parallel to the first and second control gate portions.

Although the invention is described herein with reference to specific embodiments, various modifications and changes can be made without departing from the scope of the present invention as set forth in the claims below. For example, the form of the convergence is shown as occurring at a 90 degree angle but a different angle may also be effective. Also two dummy active regions were shown associated with a strap cell but additional dummy active regions may be used as well. For example, two dummy active regions could be added in parallel with and between dummy active regions 16 and 18 so that one added dummy active region would run between contact 62 and active region 16 and the other added active region would run between dummy active region 18 and contact 62 Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one.

Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A split gate memory array having a plurality of rows, comprising:
    a first segment of split gate memory cells, comprising:
        a first plurality of split gate memory cells of the first segment along a first row of the first segment;
        a second plurality of split gate memory cells of the first segment along a second row of the first segment, wherein the second row is adjacent the first row;
        a first control gate conductor of the first segment which forms a control gate of each of the first plurality of split gate memory cells of the first segment;
        a second control gate conductor of the first segment which forms a control gate of each of the second plurality of split gate memory cells of the first segment; and
        a row strap conductor of the first segment which is physically connected between the first control gate conductor of the first segment and the second control gate conductor of the first segment;
    a second segment of split gate memory cells, comprising:
        a first plurality of split gate memory cells of the second segment along a first row of the second segment;
        a second plurality of split gate memory cells of the second segment along a second row of the second segment, wherein the second row of the second segment is adjacent the first row of the second segment;
        a first control gate conductor of the second segment which forms a control gate of each of the first plurality of split gate memory cells of the second segment;
        a second control gate conductor of the second segment which forms a control gate of each of the second plurality of split gate memory cells of the second segment; and
        a row strap conductor of the second segment which is physically connected between the first control gate conductor of the second segment and the second control gate conductor of the second segment; and
    a segment strap conductor physically connected between the row strap conductor of the first segment and the row strap conductor of the second segment.

2. The split gate memory array of claim 1, further comprising:
    a first select gate conductor which forms a select gate of each of the first plurality of split gate memory cells of the first segment and of the second segment; and
    a second select gate conductor which forms a select gate of each of the second plurality of split gate memory cells of the first segment and of the second segment;
    wherein the segment strap conductor is located between the first select gate conductor and the second select gate conductor.

3. The split gate memory array of claim 1, wherein the segment strap conductor comprises polysilicon.

4. The split gate memory array of claim 3, wherein the segment strap conductor is formed in a same polysilicon layer as the first and second control gate conductors of the first and second segments.

5. The split gate memory array of claim 3, further comprising:
    a first contact connected to the first select gate conductor between the first segment and the second segment; and
    a second contact connected to the second select gate conductor between the first segment and the second segment, wherein the segment strap conductor is located between the first and second contacts.

6. The split gate memory array of claim 1, wherein the first segment further comprises:
    a plurality of active regions which are intersected by the first control gate conductor of the first segment and the second control gate conductor of the first segment, wherein each intersection corresponds to a split gate memory cell; and
    a dummy active region, wherein the row strap conductor is over the dummy active region.

7. The split gate memory array of claim 6, wherein the first segment further comprises:
    a first source/drain contact connected to each of the active regions of the first segment, each of the first source/drain contacts located between the first control gate conductor and the second control gate conductor of the first segment.

8. The split gate memory array of claim 7, wherein the first segment further comprises:
    a second source/drain contact connected to each of the active regions of the first segment, wherein the second control gate conductor of the first segment is located between the second source/drain contacts and the first source/drain contacts.

9. The split gate memory array of claim 1, wherein the row strap conductor of the first segment is substantially perpendicular to the first and second control gate conductors of first segment and the row strap conductor of the second segment is substantially perpendicular to the first and second control gate conductors of the second segment.

10. A split gate memory array, comprising:
- a first row having memory cells;
- a second row having memory cells, wherein the second row is adjacent to the first row; and
- a plurality of segments, wherein each segment includes:
    - a first plurality of memory cells of the first row,
    - a second plurality of memory cells of the second row,
    - a first control gate portion which forms a control gate of each memory cell of the first plurality of memory cells, and
    - a second control gate portion which forms a control gate of each memory cell of the second plurality of memory cells,
- wherein the first control gate portion and the second control gate portion of one segment of the plurality of segments merge into a single control gate portion between the one of the plurality of segments and a neighboring segment of the plurality of segments.

11. The split gate memory array of claim 10, further comprising:
- a first select gate portion which forms a select gate of each memory cell of the first plurality of memory cells; and
- a second select gate portion which forms a select gate of each memory cell of the first plurality of memory cells.

12. The split gate memory array of claim 11, wherein the first select gate portion forms a select gate of a third plurality of memory cells of the first row of a neighboring segment of the plurality of segments, and the second select gate portion forms a select gate of a fourth plurality of memory cells of the second row of the neighboring segment of the plurality of segments.

13. The split gate memory array of claim 11, wherein each single control gate portion is located between the first select gate portion and the second select gate portion.

14. The split gate memory array of claim 11, further comprising:
- a first contact connected to the first select gate portion between neighboring segments of the plurality of segments; and
- a second contact connected to the second select gate portion between neighboring segments of the plurality of segments.

15. The split gate memory array of claim 14, wherein each single control gate portion between neighboring segments is located between the first contact and the second contact between the neighboring segments.

16. The split gate memory array of claim 11, wherein each segment includes:
- a plurality of active regions which are intersected by the first control gate portion and the second control gate portion;
- a first dummy active region; and
- a second dummy active region, wherein the plurality of active regions is located between the first and second dummy active regions.

17. The split gate memory array of claim 16, wherein the merge between the first and second control gate portions of the one of the plurality of segments is located between the plurality of active regions of the one of the plurality of segments and the plurality of active regions of the neighboring segment.

18. The split gate memory array of claim 16, wherein each segment includes:
- a first plurality of source/drain contacts connected to each of the plurality of active regions between the first control gate portion and the second control gate portion; and
- a second plurality of source/drain contacts connected to each of the plurality of active regions, wherein the second control gate portion and the second select gate portion are located between the first plurality of source/drain contacts and the second plurality of source/drain contacts.

19. The split gate memory array of claim 10, wherein the single control gate portion is formed in a same polysilicon layer as the first and second control gate portions.

20. The split gate memory array of claim 10, wherein the single control gate portion is substantially parallel to the first and second control gate portions.

* * * * *